(12) United States Patent
Ikemoto et al.

(10) Patent No.: US 6,372,410 B1
(45) Date of Patent: Apr. 16, 2002

(54) RESIST STRIPPING COMPOSITION

(75) Inventors: Kazuto Ikemoto; Kojiro Abe; Tetsuo Aoyama, all of Niigata-ken (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 0 days.

(21) Appl. No.: 09/668,473

(22) Filed: Sep. 25, 2000

(30) Foreign Application Priority Data

Sep. 28, 1999 (JP) .................................. 11-275200

(51) Int. Cl.⁷ .................................. G03C 5/00
(52) U.S. Cl. .................. 430/318; 430/329; 430/313; 430/331; 510/175; 510/176
(58) Field of Search .................. 430/331, 329, 430/318, 313; 510/175, 176

(56) References Cited

U.S. PATENT DOCUMENTS

| | | | |
|---|---|---|---|
| 5,529,887 A | * 6/1996 | Horn et al. | 430/331 |
| 5,905,063 A | * 5/1999 | Tanabe et al. | 510/176 |
| 5,972,862 A | * 10/1999 | Torii et al. | 510/175 |
| 6,068,000 A | 5/2000 | Tanabe et al. | 134/1.3 |

FOREIGN PATENT DOCUMENTS

| | | |
|---|---|---|
| EP | 0773480 | 5/1997 |
| EP | 0901160 | 3/1999 |
| EP | 1035446 | 9/2000 |
| WO | 0101474 | 1/2001 |

OTHER PUBLICATIONS

Abstract of JP 8–202052; Patent Abstracts of Japan, Publication No. 08202052, published Aug. 9, 1996.

* cited by examiner

Primary Examiner—Richard L. Schilling
(74) Attorney, Agent, or Firm—Antonelli, Terry, Stout & Kraus, LLP

(57) ABSTRACT

A resist stripping composition contains 0.001 to 0.5% by weight of a fluorine compound, 50 to 99% by weight of an ether solvent and the balance being substantially water. With such a specific content range of the ether solvent, the resist stripping composition shows reduced corrosive properties when diluted with water in the rinsing step as well as shows complete removal of resist residues without causing corrosion of wiring materials and substrate materials.

23 Claims, 1 Drawing Sheet

RESIST STRIPPING COMPOSITION

BACKGROUND OF THE INVENTION

1. Field of the Invention

The present invention relates to a resist stripping composition for use in the production of semiconductor integrated circuits, and more particularly, to a resist stripping composition for removing resist residues remaining after etching or ashing.

2. Description of the Prior Art

Semiconductor devices such as IC and LSI, and liquid crystal panel elements have been generally produced by the steps of forming a photoresist film on an inorganic substrate; patterning the photoresist film by exposure to light and subsequent development; dry-etching unmasked portion of the inorganic substrate with a reactive gas using the patterned photoresist film as a mask; ashing the photoresist film; and removing the photoresist residues (protective deposition film) from the inorganic substrate. Since the dry-etching of the inorganic substrate through the patterned photoresist film has been usually performed using a halogen-based reactive gas, undesired resist (photoresist) residues result from the reaction between the halogen-based reactive gas and the resist. The resist residues tend to cause various troubles such as open circuit and abnormal wiring and, therefore, must be completely removed.

Conventionally, alkaline stripping solutions have been generally used to remove the resist residues. As the alkaline stripping solutions, proposed are a stripping solution containing an alkanol amine or an ethylene oxide adduct of a polyalkylene polyamine, a sulfone compound and a glycol monoalkyl ether (Japanese Patent Applications Laid-Open No. 62-49355); a stripping solution containing dimethylsulfoxide as a main ingredient, a diethyleneglycol monoalkyl ether and a nitrogen-containing organic hydroxy compound (Japanese Patent Applications Laid-Open No.64-42653); and the like. These alkaline stripping solutions, however, show alkaline nature due to amine liberated from the adduct by the action of water absorbed during the use, or show alkaline nature during washing after the stripping treatment if the washing is made using water instead of using an organic solvent such as alcohol, thereby likely to cause severe corrosion of aluminum, etc. widely used as materials for forming fine wirings. Therefore, the known stripping solutions are unsuitable for use in micro-processing techniques requiring a recent strict dimensional accuracy.

Recently, an aqueous solution containing a fluorine compound, amide, dimethylsulfoxide (DMSO) solvent and a corrosion inhibitor comes into use as the resist stripping solution due to its high stripping capability and easiness to use (Japanese Patent Application Laid-Open No. 8-202052 and U.S. Pat. No. 5,962,385). However, these fluorine-based resist stripping solutions corrode wiring made of aluminum during rinsing with water after the stripping treatment. Namely, these stripping solutions are highly corrosive to the wiring materials when diluted with water. In addition, the fluorine compound deposits when the fluorine-based resist stripping solutions are rinsed with an organic solvent. Therefore, the removal of resist residues is insufficient merely by rinsing the fluorine-based resist stripping solutions with an organic solvent after the stripping treatment.

The present invention has been made to solve the above problems in the prior art, namely, an object of the present invention is to provide a resist stripping composition which completely removes resist residues remaining after etching or ashing in a wiring process for manufacturing semiconductor devices such as IC and LSI or liquid crystal panel elements, at a low temperature in a short period of time without causing corrosion of the wiring materials during the rinse. Another object of the present invention is to provide a process for producing a semiconductor device, the process including a rinsing treatment of the semiconductor device with a rinsing solution after the treatment with the resist stripping composition.

SUMMARY OF THE INVENTION

As a result of extensive studies in view of the above objects, the present inventors have found that an aqueous solution containing 0.001 to 0.5% by weight of a fluorine compound and 50 to 99% by weight, particularly 81 to 99% by weight of an ether solvent is suitable as the resist stripping composition because it quite easily removes resist residues remaining after etching or ashing without any corrosion of the wiring materials, etc. and also causes no corrosion of the wiring during the rinsing after the treatment with the aqueous solution. The present invention has been accomplished based on this finding.

Thus, the present invention provides a resist stripping composition comprising 0.001 to 0.5% by weight of a fluorine compound and 50 to 99% by weight of an ether solvent, the balance being substantially water.

The present invention further provides a process for producing a semiconductor device, comprising the steps of (1) forming a resist film on a thin conductive film deposited on an inorganic substrate, (2) patterning the resist film, (3) etching the thin conductive film using the patterned resin film as a mask, (4) removing resist residues remaining after the etching by contacting the resist residues with the resist stripping composition mentioned above, and (5) rinsing the resultant device with a water-soluble organic solvent or a mixed solvent of the water-soluble organic solvent and water.

The present invention still further provides a process for producing a semiconductor device, comprising the steps of (1) forming a resist film on a thin conductive film deposited on an inorganic substrate, (2) patterning said resist film, (3) etching the thin conductive film using the patterned resist film as a mask, (4) ashing the patterned resist film, (5) removing resist residues remaining after the ashing by contacting the resist residues with the resist stripping composition mentioned above, and (6) rinsing the resultant device with a water-soluble organic solvent or a mixed solvent of the water-soluble organic solvent and water.

DETAILED DESCRIPTION OF THE INVENTION

Figure 1:
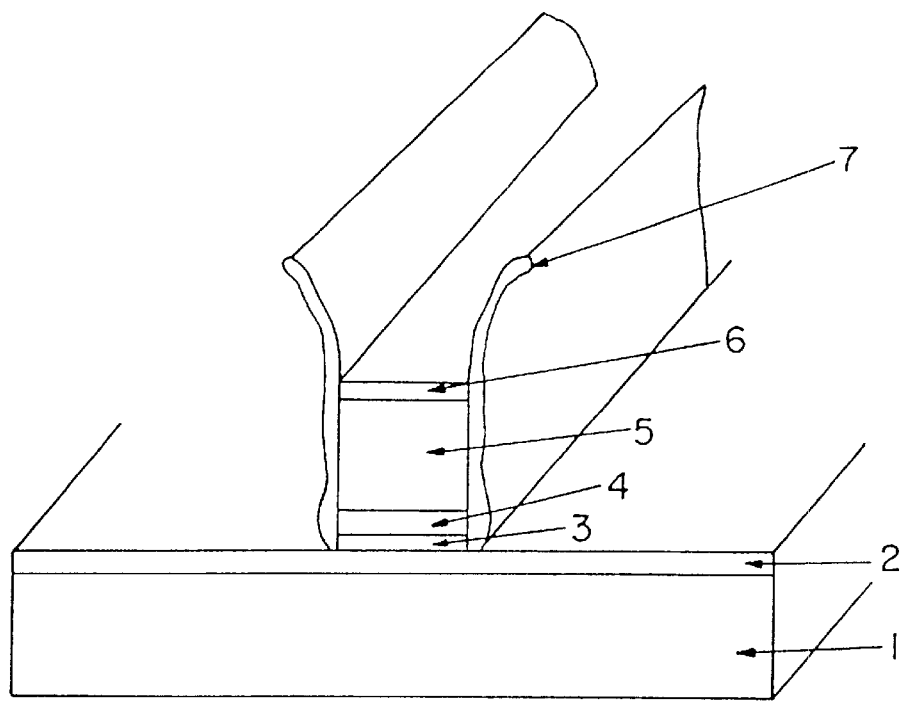
FIG. 1 is a partially cutaway view in perspective of an Al—Cu alloy wiring board after oxygen-plasma ashing and before stripping.

The fluorine compounds usable in the present invention are hydrofluoric acid, ammonium fluorides and amine hydrofluorides including ammonium fluoride, acid ammonium fluoride, methylamine hydrofluoride, ethylamine hydrofluoride, propylamine hydrofluoride, tetramethylammonium fluoride, tetraethylammonium fluoride, ethanolamine hydrofluoride, methylethanolamine hydrofluoride, dimethylethanolamine hydrofluoride, hydroxylamine hydrofluoride, dimethylhydroxylamine hydrofluoride, triethylenediamine hydrofluoride, etc. Of these fluorine compounds, ammonium fluoride and tetramethylammonium fluoride are preferred, and ammonium fluoride is more preferred. These fluorine compounds may be used alone or in combination of two or more.

The fluorine compound is contained 0.001 to 0.5% by weight based on the total weight of the resist stripping composition. When the content of the fluorine compound is more than 0.5% by weight, the corrosion during the rinsing treatment becomes severe. By regulating the content of the fluorine compound within the range of 0.5% by weight or lower, the occurrence of corrosion during the rinsing treatment is remarkably reduced, particularly, the maximum corrosive level of the resist stripping composition when diluted with water is considerably reduced.

The ether solvents used in the present invention are compounds having at least one ether bond. Examples of the ether solvents include glycol ethers such as ethylene glycol monomethyl ether, ethylene glycol monoethyl ether, ethylene glycol monobutyl ether, ethylene glycol dimethyl ether, ethylene glycol diethyl ether, diethylene glycol monomethyl ether, diethylene glycol monoethyl ether, diethylene glycol monopropyl ether, diethylene glycol monoisopropyl ether, diethylene glycol monobutyl ether, diethylene glycol monoisobutyl ether, diethylene glycol monobenzyl ether, diethylene glycol dimethyl ether, diethylene glycol diethyl ether, triethylene glycol monomethyl ether, triethylene glycol dimethyl ether, polyethylene glycol monomethyl ether, diethylene glycol methyl ethyl ether, triethylene glycol, ethylene glycol monomethyl ether acetate, ethylene glycol monoethyl ether acetate, propylene glycol monomethyl ether, propylene glycol dimethyl ether, propylene glycol monobutyl ether, dipropylene e glycol monomethyl ether, dipropylene glycol monopropyl ether, dipropylene glycol monoisopropyl ether, dipropylene glycol monobutyl ether, dipropylene glycol dimethyl ether, dipropylene glycol dipropyl ether, dipropylene glycol diisopropyl ether, tripropylene glycol and tripropylene glycol monomethyl ether, 1-methoxy-2-butanol, 2-methoxy-1-butanol, 2-methoxy-2-methylbutanol, dioxane, trioxane, 1,1-dimethoxyethane, tetrahydrofuran, crown ethers, etc. Of these ether solvents, preferred are glycol ethers due to their easy availability and easy handling. More preferred are diethylene glycol monomethyl ether, diethylene glycol monobutyl ether, diethylene glycol dimethyl ether, triethylene glycol monomethyl ether, and dipropylene glycol monomethyl ether. These ether solvents may be used alone or in combination of two or more.

The ether solvent is contained 50 to 99% by weight, preferably 70 to 99% by weight, more preferably 81 to 99% by weight based on the total weight of the resist stripping composition. When the content of the ether solvent is lower than 50% by weight, corrosion of the wiring materials during the rising treatment cannot be effectively minimized, namely, the maximum corrosive level of the resist stripping composition when diluted with water cannot be sufficiently reduced.

The content of water in the resist stripping composition of the present invention is determined depending upon the contents of the fluorine compound and the ether solvent and the addition amounts of an optional corrosion inhibitor and other optional additives so as to add up to 100% by weight.

The resist stripping composition according to the present invention may contain a corrosion inhibitor, which may include sugars such as fructose, glucose, galactose and sorbose; sugar alcohols such as sorbitol, xylitol and erythritol; polyphenols such as gallotannin, ellagitannin, catechin and proanthocyan; and quaternary ammonium salts such as tetramethylammonium hydroxide, tetramethylammonium carbonate and tetramethylammonium formate.

The resist stripping composition according to the present invention may further contain a corrosion inhibitor, which may include aromatic hydroxy compounds such as catechol, phenols and pyrogallol; carboxyl-containing organic compounds such as formic acid, acetic acid, propionic acid, butyric acid, isobutyric acid, oxalic acid, malonic acid, succinic acid, glutaric acid, maleic acid, fumaric acid, benzoic acid, phthalic acid, 1,2,3-benzenetricarboxylic acid, glycolic acid, lactic acid, malic acid, citric acid, acetic anhydride, phthalic anhydride, maleic anhydride, succinic anhydride and salicylic acid; organic salts of carboxyl-containing organic compounds derived from the carboxyl-containing organic compounds recited above and basic substances such as ethanolamine, trimethylamine, diethylamine and pyridine; and chelate compounds such as phosphoric acid-based chelate compounds such as 1,2-propanediaminetetramethylene phosphonic acid and hydroxyethane phosphonic acid, carboxylic acid-based chelate compounds such as ethylenediaminetetraacetic acid, dihydroxyethylglycine and nitrilotriacetic acid, amine-based chelate compounds such as bipyridine, tetraphenylporphyrin and phenanthroline, and oxime-based chelate compounds such as dimethylglyoxime and diphenylglyoxime.

These corrosion inhibitors may be used alone or in combination of two or more, generally in an amount about 0.01 to 30% by weight of the total resist stripping composition.

Also, the resist stripping composition of the present invention may contain a cationic, anionic or nonionic surfactant, generally in an amount about 0.001 to 5% by weight of the total resist stripping composition.

The resist stripping composition of the present invention may be prepared by any known methods. For example, the fluorine compound, the ether solvent, water and the optional ingredient or ingredients are mechanically mixed to form a uniform liquid. The order of addition of the ingredients is not critical, and the ingredients may be added successively or all the ingredients may be mixed simultaneously. Heating may be applied where necessary to obtain a uniform liquid.

The process for producing a semiconductor device according to the present invention includes the steps of forming a resist film on a thin conductive film deposited on an inorganic substrate; patterning the resist film; etching the thin conductive film using the patterned resist film as a mask; removing resist residues remaining after the etching by contacting the etched substrate with the resist stripping composition; and rinsing the substrate thus treated with a rising solution. Alternately, the patterned resist film may be ashed after the etching, and then the remaining resist residues are removed by the resist stripping composition. The actual conditions for forming the patterned resist film, stripping and ashing may be the same as those known and employed in the art. The conditions for stripping, e.g., the stripping temperature, the stripping time, the amount of the resist stripping composition to be used, etc., can be easily determined depending on the nature and thickness of the resist residues to be removed, as well as other factors familiar to those skilled in the art. Preferably, the substrate is contacted with the resist stripping composition at ordinary temperature or under heating, if desired, for a stripping effective period of time, generally 0.2 to 30 minutes.

As the rinsing solutions, there may be used water-soluble organic solvents such as methyl alcohol, ethyl alcohol, isopropanol, dimethylacetamide, dimethylsulfoxide (DMSO), glycol ethers and ethanolamine, or a mixed solvent composed of any of the above water-soluble organic solvents and ultrapure water. Also, ultrapure water may be used alone as the rinsing solution. The removal of the resist residues using the resist stripping composition of the present invention is sufficiently completed without deposition of the fluorine compound even by the rinsing with the water-soluble organic solvent alone.

In the process of the present invention, when the water-soluble organic solvent or the mixed solvent of the water-soluble organic solvent and water is used as the rinsing solution, the corrosive properties of the resist stripping composition when diluted with water can be considerably reduced. Especially, when the water-soluble organic solvent alone is used as the rinsing solution, no corrosion occurs during the rinsing.

The materials of the inorganic substrates used in the stripping process of the present invention may be semiconductor or wiring materials such as silicon, amorphous silicon, polysilicon, silicon oxide, silicon nitride, aluminum, aluminum alloys, titanium, titanium-tungsten, titanium nitride, tungsten, tantalum, tantalum oxides, tantalum alloys, chromium, chromium oxides, chromium alloys and ITO (indium tin oxide); compound semiconductors such as gallium-arsenic, gallium-phosphorus and indium-phosphorus; or glass for LCD substrate.

The present invention will be described in more detail by reference to the following examples. However, it should be noted that the following examples are illustrative and not intended to limit the invention thereto.

EXAMPLE 1

FIG. 1 is a partially cutaway view in perspective of an Al-alloy (Al-0.5%Cu) wiring board after dry etching and oxygen plasma ashing. An oxide film 2 was formed on a silicon substrate 1. On the oxide film 2, a titanium barrier layer 3, a titanium nitride barrier layer 4, an Al-alloy film and a titanium nitride barrier layer 6 were formed successively. An Al-alloy wiring 5 was formed by dry-etching the Al-alloy film through a patterned resist film as a mask, followed by oxygen plasma ashing of the patterned resist film. Resist residues 7 remained on side walls of the Al-alloy wiring 5 after the oxygen plasma ashing.

The Al-alloy wiring board was immersed in a solution containing 70% by weight of diethylene glycol monomethyl ether, 0.5% by weight of ammonium fluoride and the balance being water at room temperature for 10 minutes, rinsed with ultrapure water and then dried. Then, the dried board was observed under scanning electron microscope (SEM) to evaluate the removal of the resist residues remaining on the side walls of the wiring and the corrosion of the surface of the Al-alloy layer. As a result, it was confirmed that the resist residues were completely removed and no corrosion was found on the wiring.

Figure 2:
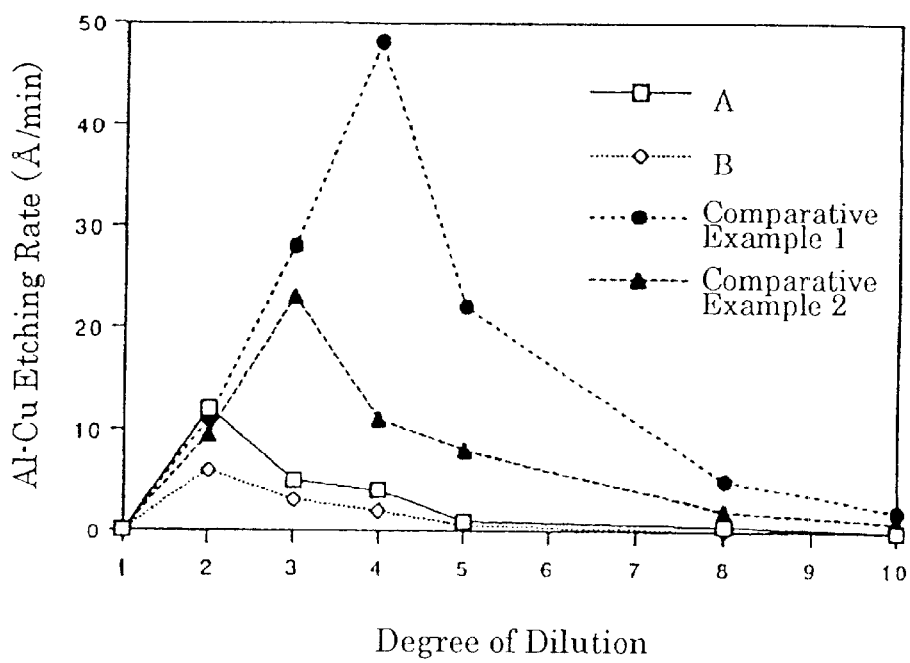
FIG. 2 is a graph showing the dependency of the corrosive properties of resist stripping compositions on the degree of dilution with water.

The Al-Cu etching rates when the Al-alloy wiring board was contacted with resist stripping compositions diluted with ultrapure water to various degree of dilution are shown in FIG. 2. In FIG. 2, the abscissa indicates the degree of dilution, namely, the degree of dilution "1" means the original concentration, the degree of dilution "2" means half the original concentration, and so on. The ordinate indicates the Al—Cu etching rate. As seen from FIG. 2, it was confirmed that the maximum etching rate of the water-diluted resist stripping compositions was as low as about 12 Å/min.

EXAMPLES 2–10

The same procedure as in Example 1 was repeated except for changing the formulation of resist stripping compositions to those shown in Table 1. The results are shown in Table 1 where the etching rates with variant degrees of dilution are shown by A, B or C where A and B correspond to the lines A and B in FIG. 2 and C means no observable Al—Cu etching.

TABLE 1

| Example No. | Ether solvent | Fluorine compound | Additive | Water |
|---|---|---|---|---|
| 2 | MDG 90% | NH$_4$F 0.2% | — | 9.8% |
| 3 | BDG 85% | NH$_4$F 0.05% | — | 14.95% |
| 4 | DMDG 85% | NH$_4$F 0.05% | — | 14.95% |
| 5 | MTG 85% | NH$_4$F 0.2% | — | 14.8% |
| 6 | MDG 90% | NH$_4$F 0.2% | PDTP 0.01% | 9.79% |
| 7 | MDG 85% | NH$_4$F 0.2% | TMAF 0.1% | 14.79% |
| 8 | MDG 85% | NH$_4$F 0.2% EAHF 0.0005% | — | 14.7995% |
| 9 | MDP 75% | NH$_4$F 0.05% | — | 24.95% |
| 10 | MDG 85% | NH$_4$F 0.2% | PRA 0.1% | 14.7% |

| Example No. | Removal | Corrosion of Al | Al—Cu etching rate when diluted |
|---|---|---|---|
| 2 | Complete removal | None | B |
| 3 | Complete removal | None | C |
| 4 | Complete removal | None | C |
| 5 | Complete removal | None | B |
| 6 | Complete removal | None | B |
| 7 | Complete removal | None | B |
| 8 | Complete removal | None | B |
| 9 | Complete removal | None | C |
| 10 | Complete removal | None | B |

MDG: Diethylene glycol monomethyl ether
BDG: Diethylene glycol monobutyl ether
MTG: Triethylene glycol monomethyl ether
DMDG: Diethylene glycol dimethyl ether
MDP: Dipropylene glycol monomethyl ether
EAHF: Ethanolamine hydrofluoride
PDTP: Propanediaminetetramethylene phosphonic acid
TMAF: Tetramethylammonium formate
PRA: Propionic acid

EXAMPLE 11

An Al-alloy wiring board after ashing was immersed in a solution containing 70% by weight of diethylene glycol monomethyl ether, 0.5% by weight of ammonium fluoride and the balance being water at room temperature for 10 minutes, rinsed with isopropanol alone and then dried. Then, the dried wiring board was evaluated in the same manner as in Example 1. As a result, it was confirmed that resist residues were completely removed.

EXAMPLE 12

An Al-alloy wiring board after ashing was immersed in a solution containing 70% by weight of diethylene glycol monomethyl ether, 0.5% by weight of ammonium fluoride and the balance being water at room temperature for 10 minutes, rinsed with a mixed solution of isopropanol/water= 4/1, and then dried. Then, the dried wiring board was evaluated in the same manner as in Example 1. As a result, it was confirmed that resist residues were completely removed.

COMPARATIVE EXAMPLE 1

An Al-alloy wiring board was immersed in a solution containing 69% by weight of dimethylformamide (DMF), 1% by weight of ammonium fluoride and the balance being water at room temperature for 10 minutes, rinsed with isopropanol alone and then dried. Then, the dried wiring board was observed under scanning electron microscope (SEM) to evaluate the removal of the resist residues remaining on the side walls of the wiring and the corrosion on the surface of the Al alloy layer. As a result, it was confirmed that the resist residues still remained unremoved and the surface of the Al-alloy layer was corroded.

The Al—Cu etching rates of the water-diluted resist stripping compositions with variant degrees of dilution are shown in FIG. 2.

COMPARATIVE EXAMPLE 2

The Al—Cu etching rates of the water-diluted resist stripping composition with variant degrees of dilution are shown in FIG. 2. The original formulation of the solution was 75% by weight of diethylene glycol monomethyl ether, 1% by weight of ammonium fluoride and the balance being water.

COMPARATIVE EXAMPLE 3

An Al-alloy wiring board was immersed in a 0.5-wt. % ammonium fluoride aqueous solution at room temperature for 10 minutes, rinsed with water and then dried. Then, the dried wiring board was evaluated in the same manner as in Example 1. As a result, it was confirmed that the resist residues still remained unremoved and the surface of the Al-alloy layer was corroded.

EXAMPLES 13–22

The same procedures as in Examples 1 to 10 were repeated except for using the wiring board having the wiring made of Cu instead of the Al—Cu alloy. Each maximum Cu etching rate of the resist stripping composition when diluted with water is shown in Table 2.

TABLE 2

| Example No. | Maximum Cu etching rate (Å/min) |
| --- | --- |
| 13 | <1 |
| 14 | <1 |
| 15 | <1 |
| 16 | <1 |
| 17 | <1 |
| 18 | <1 |
| 19 | <1 |
| 20 | <1 |
| 21 | <1 |
| 22 | <1 |

As described above, by using the resist stripping composition according to the present invention, resist residues remaining after etching or ashing are easily removed without any corrosion of wiring materials or the like, and the corrosion of Al-containing wiring materials during the rinse with water is effectively reduced.

What is claimed is:

1. A resist stripping composition comprising 0.001 to 0.5% by weight of a fluorine compound, 0.01 to 30% by weight of a corrosion inhibitor, 50 to 99% by weight of an ether solvent and the balance being substantially water, the corrosion inhibitor being selected from the group consisting of quaternary ammonium salts, organic salts derived from a carboxyl-containing organic compound and a basic substance, phosphoric acid-based chelate compounds, carboxylic acid-based chelate compounds, amine-based chelate compounds, and oxime-based chelate compounds.

2. The resist stripping composition according to claim 1, wherein said fluorine compound is at least one compound selected from the group consisting of hydrofluoric acid, ammonium fluoride and amine hydrofluorides.

3. The resist stripping composition according to claim 1, wherein said fluorine compound is ammonium fluoride.

4. The resist stripping composition according claim 1, wherein said ether solvent is at least one compound selected from the group consisting of glycol ethers, 1-methoxy-2-butanol, 2-methoxy-1-butanol, 2-methoxy-2-methylbutanol, dioxane, trioxane, 1,1-dimethoxy ethane, tetrahydrofuran and crown ethers.

5. The resist stripping composition according to claim 1, wherein said ether solvent is at least one glycol ether.

6. The resist stripping composition according to claim 5, wherein said at least one glycol ether is selected from the group consisting of ethylene glycol monomethyl ether, ethylene glycol monoethyl ether, ethylene glycol monobutyl ether, ethylene glycol dimethyl ether, ethylene glycol diethyl ether, diethylene glycol monomethyl ether, diethylene glycol monoethyl ether, diethylene glycol monopropyl ether, diethylene glycol monoisopropyl ether, diethylene glycol monobutyl ether, diethylene glycol monoisobutyl ether, diethylene glycol monobenzyl ether, diethylene glycol dimethyl ether, diethylene glycol diethyl ether, triethylene glycol monomethyl ether, triethylene glycol dimethyl ether, polyethylene glycol monomethyl ether, diethylene glycol methyl ethyl ether, triethylene glycol, ethylene glycol monomethyl ether acetate, ethylene glycol monoethyl ether acetate, propylene glycol monomethyl ether, propylene glycol dimethyl ether, propylene glycol monobutyl ether, dipropylene glycol monomethyl ether, dipropylene glycol monopropyl ether, dipropylene glycol monoisopropyl ether, dipropylene glycol monobutyl ether, dipropylene glycol dimethyl ether, dipropylene glycol dipropyl ether, dipropylene glycol diisopropyl ether, tripropylene glycol and tripropylene glycol monomethyl ether.

7. The resist stripping composition according to claim 5, wherein said at least one glycol ether is selected from the group consisting of diethylene glycol monomethyl ether, diethylene glycol monobutyl ether, diethylene glycol dimethyl ether, triethylene glycol monomethyl ether, and dipropylene glycol monomethyl ether.

8. The resist stripping composition according to claim 1, wherein the quaternary ammonium salts are selected from the group consisting of tetramethylammonium hydroxide, tetramethylammonium carbonate and tetramethylammonium formate.

9. The resist stripping composition according to claim 8, wherein the corrosion inhibitor includes at least one of the quaternary ammonium salts.

10. The resist stripping composition according to claim 1, wherein the carboxyl-containing organic compounds are selected from the group consisting of formic acid, acetic acid, propionic acid, butyric acid, isobutyric acid, oxalic acid, malonic acid, succinic acid, glutaric acid, maleic acid, fumaric acid, benzoic acid, phthalic acid, 1,2,3-benzenetricarboxylic acid, glycolic acid, lactic acid, malic acid, citric acid, acetic anhydride, phthalic anhydride, maleic anhydride, succinic anhydride and salicyclic acid; and the basic substance is selected from the group consisting of ethanolamine, trimethylamine, diethylamine and pyridine.

11. The resist stripping composition according to claim 10, wherein the corrosion inhibitor includes at least one of the organic salts derived from the carboxyl-containing organic compound and the basic substance.

12. The resist stripping composition according to claim 1, wherein the phosphoric acid-based chelate compounds are selected from the group consisting of 1,2-propanediaminetetramethylene phosphonic acid and hydroxyethane phosphonic acid.

13. The resist stripping composition according to claim 12, wherein the corrosion inhibitor includes at least one of the phosphoric acid-based chelate compounds.

14. The resist stripping composition according to claim 1, wherein the carboxylic acid-based chelate compounds are selected from the group consisting of ethylenediaminetetraacetic acid, dihydroxyethylglycine and nitrilotriacetic acid.

15. The resist stripping composition according to claim 14, wherein the corrosion inhibitor includes at least one of the carboxylic acid-based chelate compounds.

16. The resist stripping composition according to claim 1, wherein the amine-based chelate compounds are selected from the group consisting of bipyridine, tetraphenylporphyrin and phenanthroline.

17. The resist stripping composition according to claim 16, wherein the corrosion inhibitor includes at least one of the amine-based chelate compounds.

18. The resist stripping composition according to claim 1, wherein the oxime-based chelate compounds are selected from the group consisting of dimethylglyoxime and diphenylglyoxime.

19. The resist stripping composition according to claim 18, wherein the corrosion inhibitor includes at least one of the oxime-based chelate compounds.

20. The resist stripping composition according to claim 1, wherein the ether solvent is included in an amount of 70 to 99% by weight.

21. The resist stripping composition according to claim 14, wherein the ether solvent is included in an amount of 81 to 99% by weight.

22. A process for producing a semiconductor device, comprising the steps of:

forming a resist film on a thin conductive film deposited on an inorganic substrate;

patterning said resist film;

etching the thin conductive film using the patterned resin film as a mask;

removing resist residues remaining after the etching by contacting the resist residues with the resist stripping composition according to claim 1; and rinsing the resultant substrate with a water-soluble organic solvent or a mixed solution of the water-soluble organic solvent and water.

23. A process for producing a semiconductor device, comprising:

forming a resist film on a thin conductive film deposited on an inorganic substrate;

patterning said resist film;

etching the thin conductive film using the patterned resist film as a mask;

ashing the patterned resist film;

removing resist residues remaining after the ashing by contacting the resist residues with the resist stripping composition according to claim 1; and rinsing the resultant substrate with a water-soluble organic solvent or a mixed solution of the water-soluble organic solvent and water.

* * * * *